(12) United States Patent
Sabina et al.

(10) Patent No.: US 7,639,160 B2
(45) Date of Patent: Dec. 29, 2009

(54) RAILWAY BEACON AND RELATED PRODUCTION METHOD

(75) Inventors: Salvatore Sabina, Pisa (IT); Giovanni Canepa, Genoa (IT)

(73) Assignee: Ansaldo STS S.p.A., Genoa (IT)

( * ) Notice: Subject to any disclaimer, the term of this patent is extended or adjusted under 35 U.S.C. 154(b) by 591 days.

(21) Appl. No.: 10/581,383

(22) PCT Filed: Dec. 1, 2004

(86) PCT No.: PCT/EP2004/053217

§ 371 (c)(1),
(2), (4) Date: Aug. 28, 2006

(87) PCT Pub. No.: WO2005/054030

PCT Pub. Date: Jun. 16, 2005

(65) Prior Publication Data

US 2007/0096983 A1    May 3, 2007

(30) Foreign Application Priority Data

Dec. 5, 2003  (IT)  .................. TO2003A0978

(51) Int. Cl.
*G08G 1/01*    (2006.01)
(52) U.S. Cl. ................................ 340/933; 340/439
(58) Field of Classification Search ............ 340/933, 340/917, 439; 403/203; 705/36
See application file for complete search history.

(56) References Cited

U.S. PATENT DOCUMENTS

| | | | |
|---|---|---|---|
| 6,262,657 B1 * | 7/2001 | Okuda et al. | 340/439 |
| 6,429,790 B1 * | 8/2002 | Frese et al. | 340/905 |
| 2003/0076662 A1 | 4/2003 | Miehling | |

FOREIGN PATENT DOCUMENTS

| | | |
|---|---|---|
| EP | 0 996 085 | 4/2000 |
| EP | 1 467 315 | 10/2004 |
| GB | 2 163 324 | 2/1986 |
| WO | WO 00/43952 | 7/2000 |

OTHER PUBLICATIONS

L. Reindel et al., "Hybrid Saw-Device for a European Train Control System", Ultrasonics Symposium, 1994, pp. 175-179.

\* cited by examiner

*Primary Examiner*—Daniel Wu
*Assistant Examiner*—Shirley Lu
(74) *Attorney, Agent, or Firm*—Gottlieb, Rackman & Reisman

(57) ABSTRACT

A railway beacon having a casing (3) supporting an electronic circuit (4), which receives an electromagnetic enabling signal from a vehicle travelling along a railway line, and generates a coded response signal (telegram) transmitted to the vehicle. The casing (3) is formed in one piece from insulating material, and has at least one sunken seat (12a) housing the electronic circuit (4), which is embedded in a layer of insulating silicone resin (40) poured and set inside the sunken seat.

6 Claims, 3 Drawing Sheets

RAILWAY BEACON AND RELATED PRODUCTION METHOD

TECHNICAL FIELD

The present invention relates to a railway beacon (balise), and to a method of producing a railway beacon (balise).

BACKGROUND ART

Railway beacons (also known by the French term "balise") are known which are laid along a railway line, and each comprise a casing supporting an electronic circuit, which receives an electromagnetic enabling signal from a vehicle travelling along the railway line, and generates a coded response signal (telegram) transmitted to the vehicle and containing information relative to the location and travel of the vehicle.

Beacons of this sort also comprise a receiving antenna and a transmitting antenna, both carried by the casing and cooperating with the electronic circuit to receive/transmit electromagnetic signals from/to the vehicle.

The beacons are laid between the rails of the railway line, and are anchored to the sleepers by means of a kit ensuring firm attachment to the railway line. As such, the beacons are exposed to various external agents which may damage the beacon itself and/or the electronic circuit inside.

Such external agents include:
atmospheric agents (steam, rain, ice and snow) to which the beacon is exposed;
mechanical stress on the beacon, such as vibration produced by passing vehicles, or thermal stress caused by heating/cooling of the beacon;
chemical agents (acid, oil, powdered carbon, sulphur, iron, zinc, etc.) to which the beacon is exposed; and
interaction of the beacon with parts of the railway line, in particular the ballast forming the base of the railway line and which may at least partly cover the beacon.

DISCLOSURE OF INVENTION

It is an object of the present invention to provide a beacon which is particularly resistant to external agents, in particular, steam, water, ice and snow.

According to the present invention, there is provided a railway beacon designed for laying along a railway line and comprising: a casing supporting at least one electronic circuit, which receives an electromagnetic enabling signal from a vehicle travelling along the railway line, and generates a coded response signal (telegram) transmitted to the vehicle and containing information relative to travel of the vehicle; and a receiving antenna and a transmitting antenna, both carried by said casing and cooperating with said electronic circuit; characterized in that said casing is formed in one piece from insulating material; said casing having at least one sunken seat housing at least one printed circuit defining said electronic circuit; said sunken seat being filled with solidified insulating resin embedding said printed circuit and the electronic components on the printed circuit; and said insulating resin containing no air, in particular no air bubbles, and comprising no water in its composition.

The present invention also relates to a method of producing a railway beacon, characterized by comprising the steps of: producing a casing made of insulating material and having at least one sunken seat; inserting an electronic circuit, formed on at least one support, in particular a printed circuit, inside said sunken seat, said electronic circuit receiving an electromagnetic enabling signal from a vehicle travelling along a railway line, and generating a coded response signal (telegram) transmitted to the vehicle and containing information relative to travel of the vehicle; producing a resin containing substantially no water particles or air; feeding said resin inside said sunken seat, so as to embed said support and the components on said support inside said resin, and allowing the resin to set to obtain a stable position of said electronic circuit inside said casing.

BRIEF DESCRIPTION OF THE DRAWINGS

A preferred, non-limiting embodiment of the invention will be described by way of example with reference to the accompanying drawings, in which.

BEST MODE FOR CARRYING OUT THE INVENTION

Figure 1:
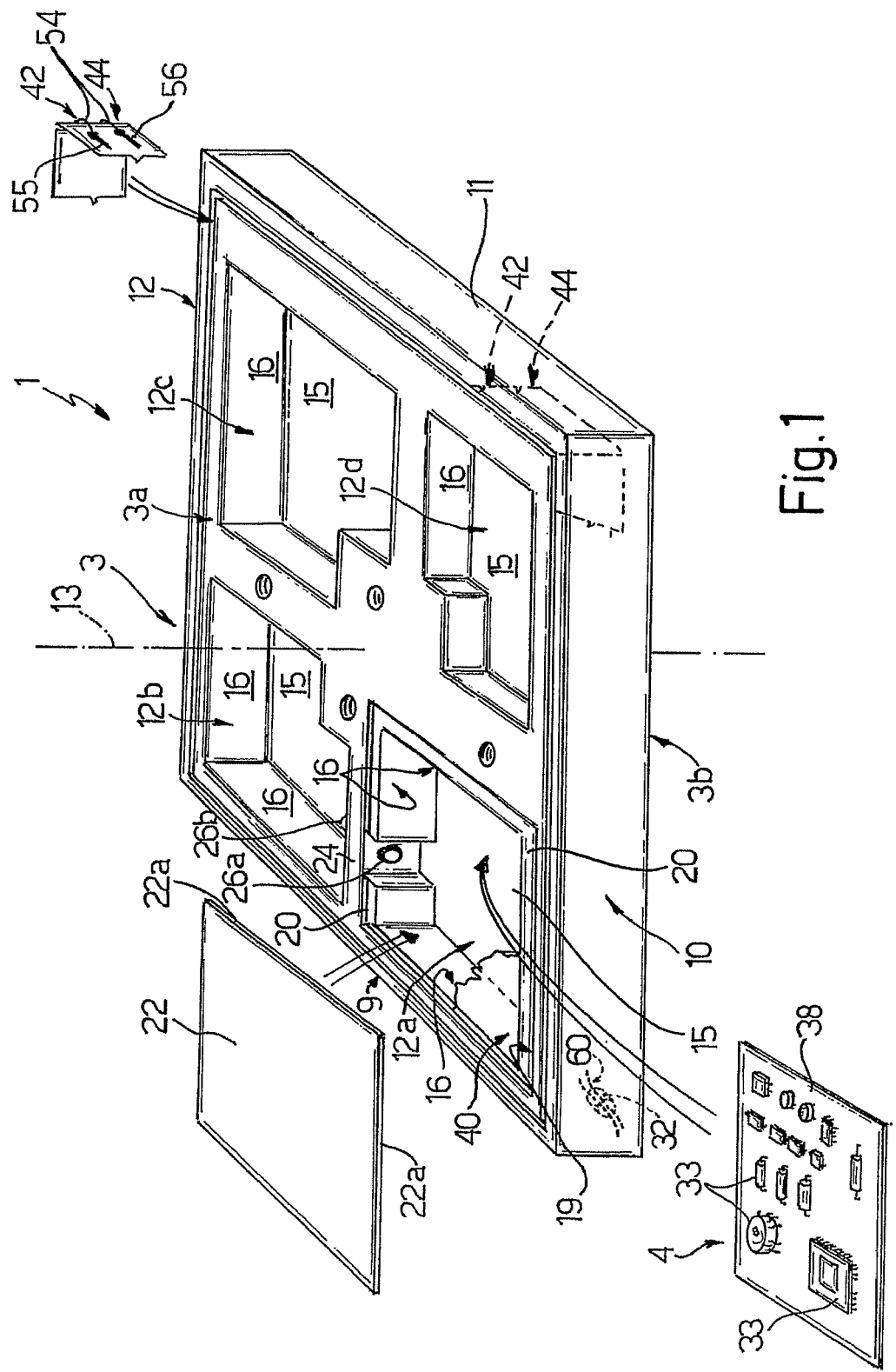
FIG. 1 shows a view in perspective of a beacon in accordance with the teachings of the present invention.

With particular reference to FIG. 1, the beacon 1 comprises an insulating casing 3 for supporting an electronic circuit 4, and for housing electronic circuit 4 in airtight manner inside beacon 1.

Beacon 1 is located between the rails of a railway line, and is fixed to the sleepers by means of an assembly kit (not shown).

Electronic circuit 4 receives an electromagnetic enabling signal from a vehicle travelling along the railway line, and generates in known manner a coded response signal (telegram) transmitted to the vehicle and containing information relative to the location and travel of the vehicle.

More specifically, casing 3 is formed in one piece from synthetic insulating material, and is in the form of a parallelepiped-shaped plate bounded on opposite sides by a flat rectangular bottom face 3a (shown facing upwards in FIG. 1 but in actual use facing downwards), and by a flat rectangular top face 3b.

Casing 3 is bounded laterally by a number of adjacent flat rectangular walls 9, 10, 11, 12 perpendicular to one another, and comprises a number of sunken, parallelepiped-shaped seats 12a, 12b, 12c, 12d (four in the example shown, but which may be any number) which open out at bottom face 3a and are arranged substantially symmetrically with respect to an axis 13 perpendicular to casing 3 and through a central portion of casing 3. Each parallelepiped-shaped seat 12 is bounded by a substantially flat rectangular bottom wall 15, and by four flat rectangular lateral walls 16.

At least one sunken seat 12a comprises, at the opening 19 at which seat 12a opens out at bottom face 3a, a sunken annular edge 20 extending along the end portions of lateral walls 16; and a flat rectangular cover plate 22 is positioned with its peripheral edges 22a resting along annular edge 20 to close opening 19 in fluidtight manner.

Two adjacent seats 12a, 12b are separated by a partition 24 fitted with a through connector 26 having a first end 26a facing sunken seat 12a, and a second end 26b facing seat 12b.

Electronic circuit 4 is defined by a number of electronic components 33 (integrated circuits, transistors, resistors, capacitors, inductors, transformers, etc.) mounted on a printed circuit 38 for supporting and electrically connecting components 33 in known manner. According to the present invention, electronic circuit 4 is housed inside sunken seat 12a, and is seated firmly inside the seat by means of a hardened silicone resin 40 embedding printed circuit 38 and electronic components 33.

More specifically, the hardened silicone resin 40 has the following characteristics:

is of insulating type (with a resistivity of about $7.1 \, 10^{13}$ Ω/cm);

contains substantially no air particles (e.g. micro air bubbles) and has a dielectric strength of 16.5 kV/mm;

contains substantially no water particles, i.e. contains substantially no water in its composition (has a water content of less than 0.1%).

According to a particular aspect of the present invention, a receiving antenna 42 and a transmitting antenna 44, both formed on the same annular support and connected to electronic circuit 4, are co-molded directly inside lateral walls 9, 10, 11, 12.

Figure 2:
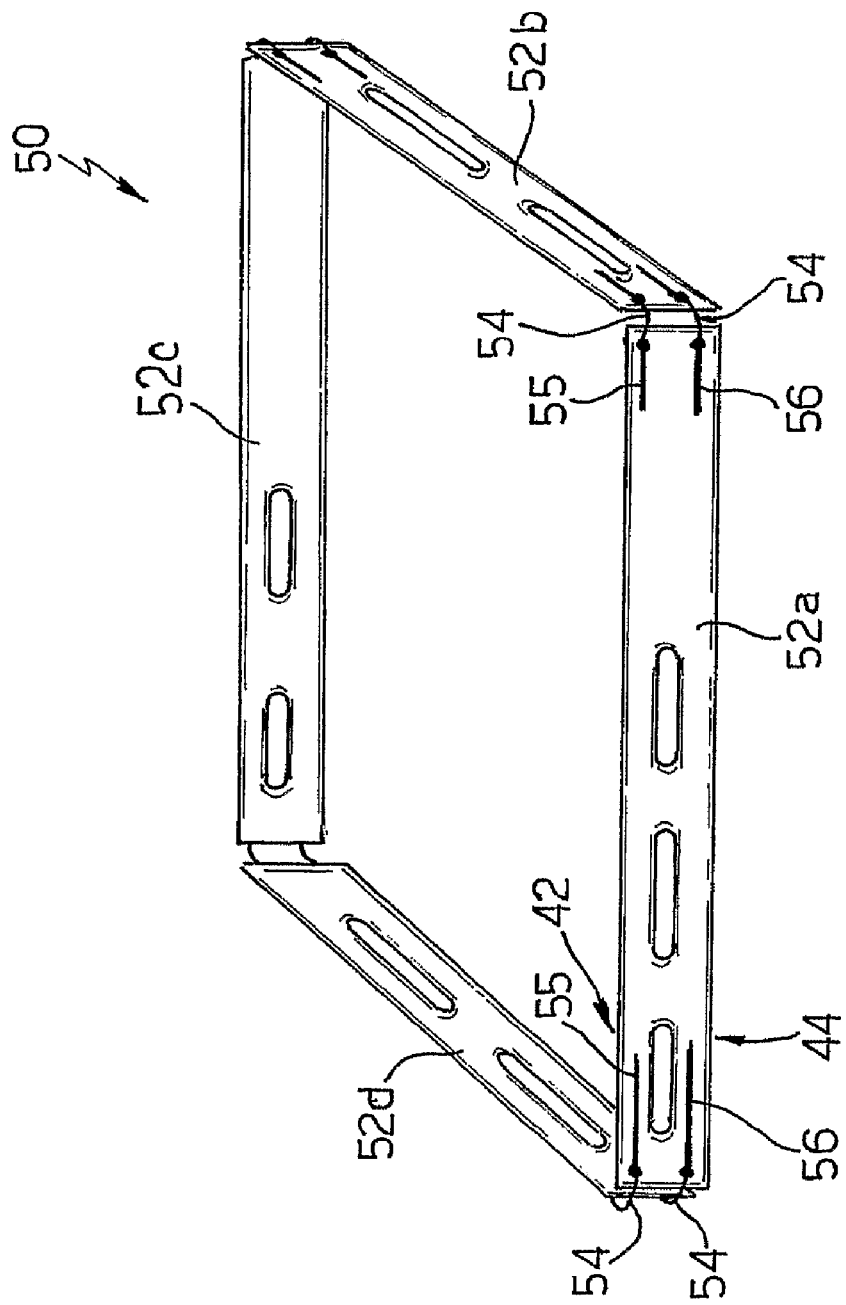
FIG. 2 shows a view in perspective of a component part (antenna) of the FIG. 1 beacon.
Figure 3A:
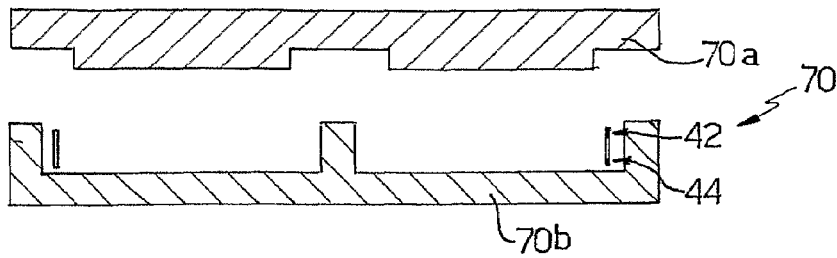
FIGS. 3a-3g show successive steps in the manufacture of the beacon using the method according to the present invention.
Figure 3B:
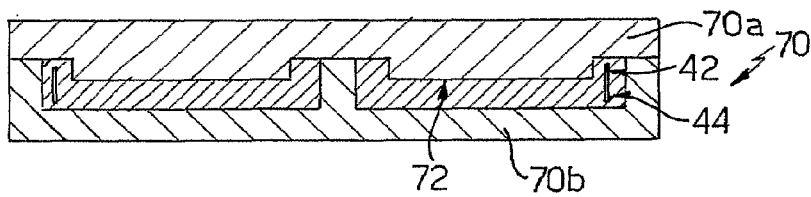
Figure 3C:
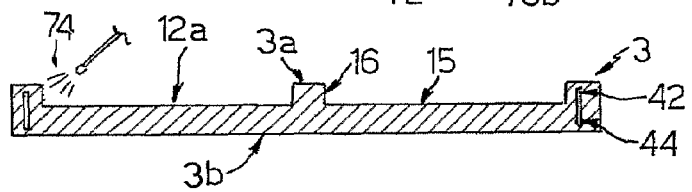
Figure 3D:
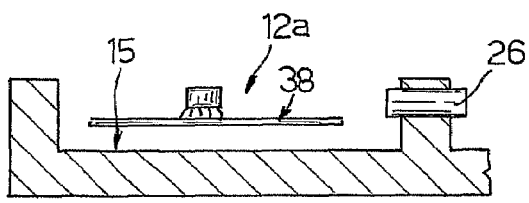
Figure 3E:
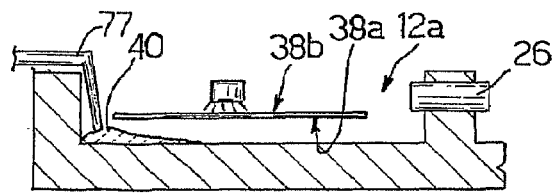
Figure 3F:
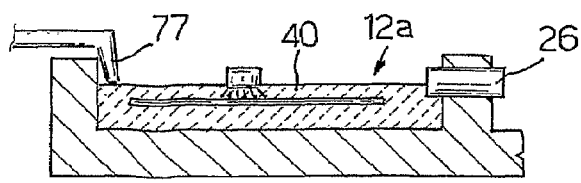
Figure 3G:
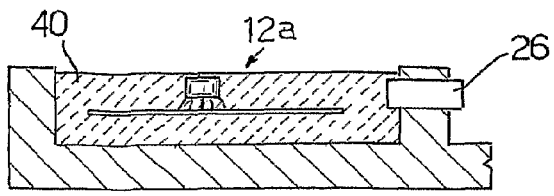

Receiving antenna 42 and transmitting antenna 44 comprise a supporting structure 50 (FIG. 2) defined by four adjacent elongated rectangular printed circuits 52a, 52b, 52c, 52d forming a rectangular frame structure. More specifically, adjacent printed circuits 52 are connected electrically and mechanically by L-shaped arcs 54 of conducting wire (e.g. copper) extending between adjacent end portions of printed circuits 52.

Each printed circuit 52 comprises a first number of copper tracks 55 connected by L-shaped arcs 54 to respective first numbers of copper tracks on the other printed circuits 52 to form, as a whole, receiving antenna 42.

Each printed circuit 52 also comprises a second number of copper tracks 56 connected by L-shaped arcs 54 to respective second numbers of copper tracks on the other printed circuits 52 to form, as a whole, transmitting antenna 44. And each rectangular printed circuit 52a, 52b, 52c, 52d is co-molded and embedded inside a relative flat rectangular wall 9, 10, 11, 12.

Electric conductors 60 extend through a through conduit 32 to connect receiving antenna 42 and transmitting antenna 44 to electronic circuit 4.

FIGS. 3a-3g show, schematically, the method of producing the beacon according to the present invention.

For this purpose, a mold 70 (FIG. 3a) may be used comprising a top half-mold 70a and a bottom half-mold 70b, preferably made of metal (e.g. stainless steel).

Half-molds 70a, 70b are closed (FIG. 3b) to form a cavity 72 complementary in shape to casing 3.

The supporting structure of antennas 42, 43 is also inserted inside cavity 72.

A mixture of heat-setting materials containing a predetermined quantity of glass fibre is then injected into cavity 72.

The mixture containing the glass fibre is allowed to set and polymerize completely (half-molds 70a and 70b may be fitted with heating resistors to speed up the process), and half-molds 70a and 70b are then opened to remove casing 3 (FIG. 3c) which, so formed, comprises sunken seats 12a-12d and incorporates antennas 42 and 44.

Casing 3 may then be coated with an insulating gel-coat 74 (FIG. 3c), which is sprayed onto all the outer surfaces of the casing, and coats lateral walls 9, 10, 11, 12, bottom face 3a, top face 3b, bottom walls 15, and lateral walls 16. Printed circuit 38 (FIG. 3d) is then placed inside sunken seat 12a, and is connected electrically to receiving antenna 42, transmitting antenna 44, and through connector 26. Printed circuit 38 is connected to antennas 42, 44 using braided cables extending in fluidtight manner through wall 10.

Resin 40 (FIG. 3e) is then poured into sunken seat 12a. The resin may preferably be a silicone resin comprising two liquid components (A and B), which are mixed and then treated in known manner to eliminate air particles and any water molecules from the mixture. Alternatively, each component (A and B) may be treated in known manner to eliminate air particles and any water molecules in the component; and the components are then mixed to form resin 40.

The resin may be poured as follows:

a nozzle 77 is placed close to printed circuit 38 and bottom wall 15 of the sunken seat (FIG. 3e), so that the poured resin 40 covers the whole of bottom wall 15, contacts a bottom face 38a of printed circuit 38, and then covers a top face 38b of printed circuit 38; when pouring the resin, nozzle 77 is preferably located on the opposite side to through connector 26, and pour speed is controlled to prevent the formation of air bubbles;

nozzle 77 (FIG. 3f) is then moved into position close to the larger components (e.g. transformers, inductors, connectors) on printed circuit 38, and resin 40 is poured so as to expel any air beneath and/or inside the components;

pouring of resin 40 continues until sunken seat 12a is filled completely with resin 40; at which point, casing 3 is transferred slowly and at controlled speed (so as not to disturb the resin) to a storage station (not shown) where resin 40 is allowed to set hard.

Manufacture of beacon 1 is completed by applying cover plate 22.

Tests conducted by the Applicant show beacon 1 to be highly resistant to external agents, in particular water, damp (steam), snow and ice, and undergoes no deterioration in electric characteristics. Electronic circuit 4 and the parts connected to it (antennas 42, 44 and connector 26), in fact, are enclosed in resin 40 or casing 3, which prevent any external agents contacting electronic circuit 4. In addition, the solidified resin 40 itself contains no elements (air or water) capable of eventually oxidizing the printed circuit tracks or connector 26 and/or affecting performance of the electronic components on the printed circuit.

The invention claimed is:

1. A railway beacon designed for laying along a railway line and comprising:

a casing supporting at least one electronic circuit, which receives an electromagnetic enabling signal from a vehicle travelling along the railway line, and generates a coded response signal, transmitted to the vehicle and containing information relative to travel of the vehicle; and a receiving antenna and a transmitting antenna, both carried by said casing and cooperating with said electronic circuit;

characterized in that said casing is formed in one piece from insulating material; said casing having at least one sunken seat housing at least one printed circuit defining said electronic circuit; said sunken seat being filled with solidified insulating resin embedding said printed circuit and the electronic components on the printed circuit; and said insulating resin containing no air, in particular no air bubbles, and comprising no water in its composition wherein said receiving antenna and said transmitting antenna comprise a supporting structure defined by a number of elongated printed circuits communicating electrically with one another and forming a frame structure; each elongated printed circuit comprising first conducting tracks connected to respective first conducting tracks of other elongated printed circuits to form, as a whole, said receiving antenna; and each elongated printed circuit also comprising second conducting tracks connected to respective second conducting tracks of the other elongated printed circuits to form, as a whole, said transmitting antenna.

2. A beacon as claimed in claim 1, wherein said receiving antenna and said transmitting antenna are co-molded with said casing.

3. A beacon as claimed in claim 1, wherein adjacent said elongated printed circuits are connected mechanically and electrically by L-shaped arcs of conducting wire extending between adjacent end portions of said elongated printed circuits.

4. A beacon as claimed in claim 1, wherein said casing is in the form of a parallelepiped-shaped plate.

5. A beacon as claimed in claim 1, wherein said sunken seat is parallelepiped-shaped.

6. A beacon as claimed in claim 1, wherein said sunken seat is closed by a flat plate positioned with its peripheral edges resting along an annular edge of the sunken seat to close said sunken seat in fluidtight manner.

* * * * *